(12) United States Patent
Chen et al.

(10) Patent No.: US 10,122,903 B2
(45) Date of Patent: Nov. 6, 2018

(54) BEZELS FOR DIE LEVEL PACKAGING OF CAMERA MODULES, AND ASSOCIATED CAMERA MODULES AND METHODS

(71) Applicant: OmniVision Technologies, Inc., Santa Clara, CA (US)

(72) Inventors: Wei-Ping Chen, New Taipei (TW); Tsung-Wei Wan, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 55 days.

(21) Appl. No.: 15/193,031

(22) Filed: Jun. 25, 2016

(65) Prior Publication Data

US 2017/0374252 A1    Dec. 28, 2017

(51) Int. Cl.
*H04N 5/225* (2006.01)
*H01L 27/146* (2006.01)

(52) U.S. Cl.
CPC ..... *H04N 5/2257* (2013.01); *H01L 27/14687* (2013.01); *H04N 5/2252* (2013.01); *H04N 5/2253* (2013.01); *H04N 5/2254* (2013.01)

(58) Field of Classification Search
CPC .. H04N 5/2257; H04N 5/2252; H04N 5/2253; H04N 5/2254; H01L 27/14687
See application file for complete search history.

(56) References Cited

U.S. PATENT DOCUMENTS

| 2006/0132644 A1* | 6/2006 | Shangguan | H01L 27/14618 348/374 |
| 2016/0219203 A1* | 7/2016 | Wan | H04N 5/2257 |

\* cited by examiner

*Primary Examiner* — Twyler Haskins
*Assistant Examiner* — Fayez Bhuiyan
(74) *Attorney, Agent, or Firm* — Lathrop Gage LLP (57) ABSTRACT

A bezel for die level packaging of a camera module may include (a) a recessed lip surrounding an aperture of the bezel and facing in a first direction, wherein the recessed lip is configured for seating thereon an image sensor, and (b) a planar rim surrounding the aperture and facing in a second direction opposite the first direction, wherein the planar rim is configured for bonding thereto a wafer-level lens unit implementing a wafer-level lens for delivering light to the image sensor through the aperture, wherein transverse extent of the planar rim across the aperture in a dimension orthogonal to the first direction exceeds corresponding transverse extent of the recessed lip.

14 Claims, 11 Drawing Sheets

BEZELS FOR DIE LEVEL PACKAGING OF CAMERA MODULES, AND ASSOCIATED CAMERA MODULES AND METHODS

BACKGROUND

Cameras are incorporated into a wide range of devices. For example, widely used consumer electronics devices, such as phones, tablets, and laptops, include a camera. To comply with the targeted cost for such devices, the camera must be manufactured at very low cost. Wafer-level manufacturing of both image sensors and imaging lenses has dramatically reduced the cost of camera modules, and semiconductor manufacturing technology is continuously progressing to reduce cost even further, and also improve the camera performance. For example, driven in part by the desire to reduce cost of materials, but also by the desire for increased camera resolution and/or smaller cameras, semiconductor manufacturing technology is continuously progressing to produce ever smaller camera pixels. This development has resulted in the availability of ever smaller image sensors.

SUMMARY

In an embodiment, a bezel for die level packaging of a camera module, includes a recessed lip and a planar rim. The recessed lip surrounds an aperture of the bezel and faces in a first direction. The recessed lip is configured for seating thereon an image sensor. The planar rim surrounds the aperture and faces in a second direction opposite the first direction. The planar rim is configured for bonding thereto a wafer-level lens unit that implements a wafer-level lens for delivering light to the image sensor through the aperture. The transverse extent of the planar rim across the aperture in a dimension orthogonal to the first direction exceeds the corresponding transverse extent of the recessed lip.

In an embodiment, a camera module includes a wafer-level lens unit, an image sensor, and a bezel. The wafer-level lens unit includes at least one wafer-level lens. The wafer-level lens unit has first transverse extent in a first dimension orthogonal to the optical axis of the wafer-level lens. The image sensor has second transverse extent, in a second dimension parallel to the light-receiving surface of the image sensor. The second transverse extent is smaller than the first transverse extent. The bezel includes opposite facing first and second sides. The wafer-level lens unit is bonded to the first side and the image sensor is inserted into the second side and bonded to the bezel, such that the first dimension is aligned with the second dimension. The bezel further includes an aperture configured to transmit light from the wafer-level lens to the light-receiving surface.

In an embodiment, a method for die-level packaging of a camera module includes placing a bezel on an image sensor to seat the image sensor in the bezel. The bezel has an aperture allowing light transmission through the bezel to a light receiving surface of the image sensor. The image sensor has first transverse extent in a first dimension parallel to light-receiving surface of the image sensor. The method further includes bonding a wafer-level lens unit to a side of the bezel facing away from the image sensor. The wafer-level lens unit includes at least one wafer-level lens. The wafer-level lens unit has second transverse extent orthogonal to optical axis of the wafer-level lens. The second transverse extent exceeds the first transverse extent.

DETAILED DESCRIPTION OF THE EMBODIMENTS

Figure 1:
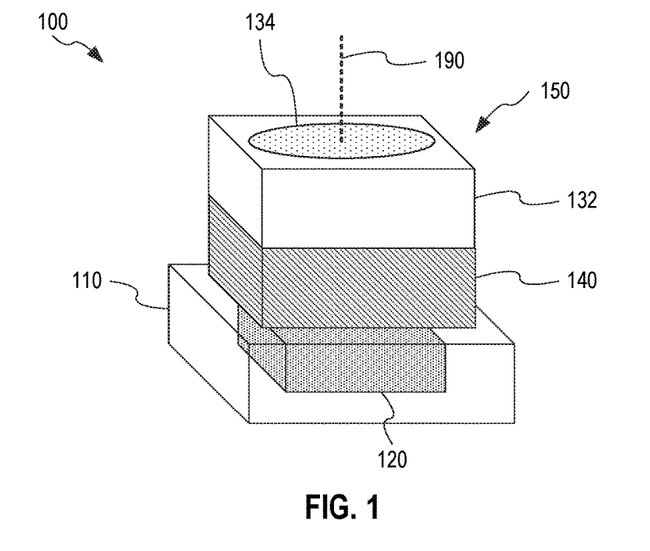
FIG. 1 is a perspective view of a bezel for die level packaging of a camera module, as well as a camera module formed thereby, according to an embodiment.
Figure 2:
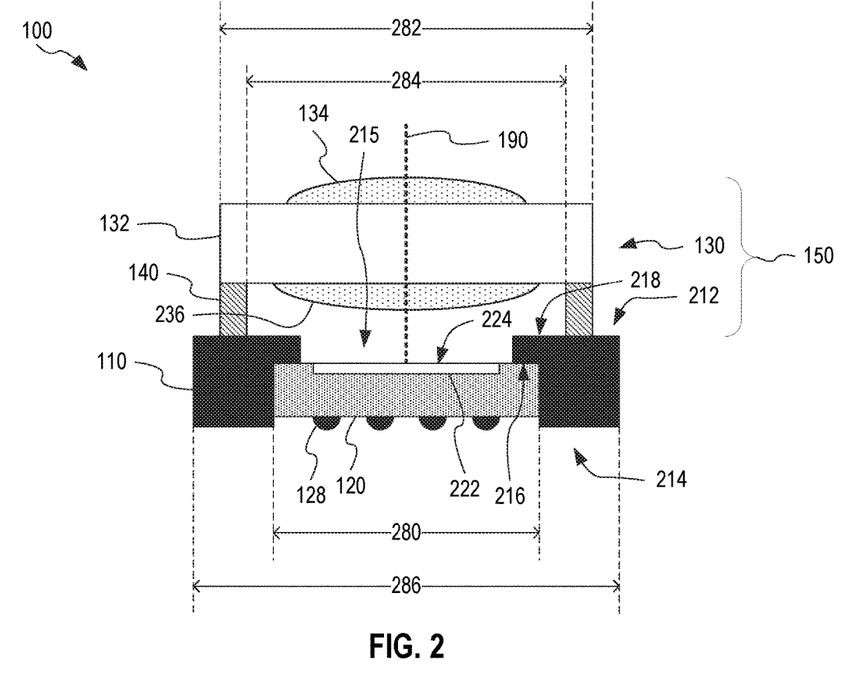
FIG. 2 is a cross-sectional side view of the bezel and camera module of FIG. 1, according to an embodiment.

FIGS. 1 and 2 illustrate one exemplary bezel 110 for die level packaging of a camera module. FIGS. 1 and 2 also illustrate a camera module 100 based upon bezel 110. Camera module 100 includes an image sensor 120, a wafer-level lens unit 150, and bezel 110 coupling wafer-level lens unit 150 to image sensor 120. FIG. 1 is a perspective view of camera module 100 with bezel 110 incorporated therein. FIG. 2 is a cross-sectional side view of camera module 100 with bezel 110 incorporated therein, wherein the cross section is taken along optical axis 190 of wafer-level lens unit 150. FIGS. 1 and 2 are best viewed together.

Bezel 110 is configured for die level packaging of wafer-level lens unit 150 to image sensor 120, that is, packaging of wafer-level lens unit 150 to image sensor 120 after dicing wafer-level lens unit 150 and image sensor 120 from respective image sensor and lens wafers. Bezel 110 is compatible with die-level packaging of wafer-level lens 130 to image sensor 120 in scenarios wherein the transverse extent of image sensor 120 is smaller than that of wafer-level lens unit 150, in at least one transverse dimension. FIGS. 1 and 2 depict such a scenario. However, without departing from the scope hereof, the transverse extent of image sensor 120 may be as large as or exceed the transverse extents of wafer-level lens unit 150.

Herein, "transverse extent/dimension" of an image sensor refers to an extent/dimension parallel to the light-receiving surface of the image sensor, and "transverse extent/dimension" of a wafer-level lens unit, or a wafer-level lens, refers to an extent/dimension orthogonal to the optical axis of the wafer-level lens unit or wafer-level lens. "Transverse extent/dimension" of a bezel refers to an extent/dimension aligned with the transverse extent/dimension of an image sensor or wafer-level lens unit to be coupled to the bezel.

Bezel 110 may be injection molded from a polymer resin. In certain embodiments, bezel 110 is made from an opaque material to help prevent light leakage into camera module 100 between wafer-level lens unit 150 and image sensor 120.

Wafer-level lens unit 150 includes a wafer-level lens 130 and a spacer 140. Wafer-level lens 130 includes a substantially planar substrate 132 and one or two lens elements bonded to substrate 132. In the exemplary embodiment depicted in FIGS. 1 and 2, wafer-level lens 130 includes (a) lens element 134 formed on a surface of substrate 132 facing away from image sensor 120 and (b) lens element 236 formed on a surface of substrate 132 facing image sensor 120. Without departing from the scope hereof, wafer-level lens 130 may include only one of lens elements 134 and 236. Likewise, wafer-level lens unit 150 may include one or more additional wafer-level lenses stacked on top of wafer-level lens 130 further away from image sensor 120, and/or other optical components such as apertures and filters. Spacer 140 forms an aperture such that light may propagate from wafer-level lens 130 toward image sensor 120.

Bezel 110 has two opposite facing sides 212 and 214. Side 212 includes a substantially planar rim 218. In camera module 100, spacer 140 is bonded to a planar rim 218 of a side 212 of bezel facing wafer-level lens 130. Bezel 110 also has a recessed lip 216 onto which image sensor 120 may be seated when inserted into bezel 110 from side 214, as is the case for camera module 100. Bezel 110 forms an aperture 215 such that light may propagate from wafer-level lens unit 150 to light-receiving surface 224 of image sensor 120. Recessed lip 216 and planar rim 218 both surround aperture 215. Image sensor 120 includes light-receiving surface 224 over a pixel array 222 of photosensitive pixels. Image sensor 120 also includes a plurality of electrical contacts 128, such as solder ball contacts. Image sensor 120 is seated in bezel 110 with light-receiving surface 224 facing wafer-level lens 130.

Recessed lip 216 has transverse extent 280 in the cross section shown in FIG. 2. In every transverse dimension, the transverse extent of image sensor 120 is the same as or less than the transverse extent of recessed lip 216. In one example, the transverse extent of image sensor 120 is selected to provide for a snug fit of image sensor 120 in bezel 110 when image sensor 120 is seated on recessed lip 216. Throughout the present disclosure, image sensor 120 will be depicted as having same transverse extents as recessed lip 216, although it is understood that the transverse extents of image sensor 120 may be smaller than recessed lip 216 as long as the transverse extents of image sensor 120 are greater than the corresponding transverse extents of aperture 215. In the exemplary embodiment depicted in FIGS. 1 and 2, the corresponding transverse extent 282 of wafer-level lens unit 150 (and wafer-level lens 130) is greater than transverse extent 280. The aperture formed by spacer 140 has corresponding transverse extent 284. In the exemplary embodiment depicted in FIGS. 1 and 2, transverse extent 284 also exceeds transverse extent 280, such that it would be impossible to bond spacer 140 directly to image sensor 120. Without departing from the scope hereof, transverse extent 284, and even transverse extent 282, may be less than transverse extent 280. Planar rim 218 of bezel 110 has transverse extent 286. Transverse extent 286 is at least as large as transverse extent 282 to ensure a reliable bond between spacer 140 and bezel 110.

Without departing from the scope hereof, bezel 110 may be a standalone component configured for use with a third-party image sensor 120 and a third-party wafer-level lens unit 150.

Figure 3:
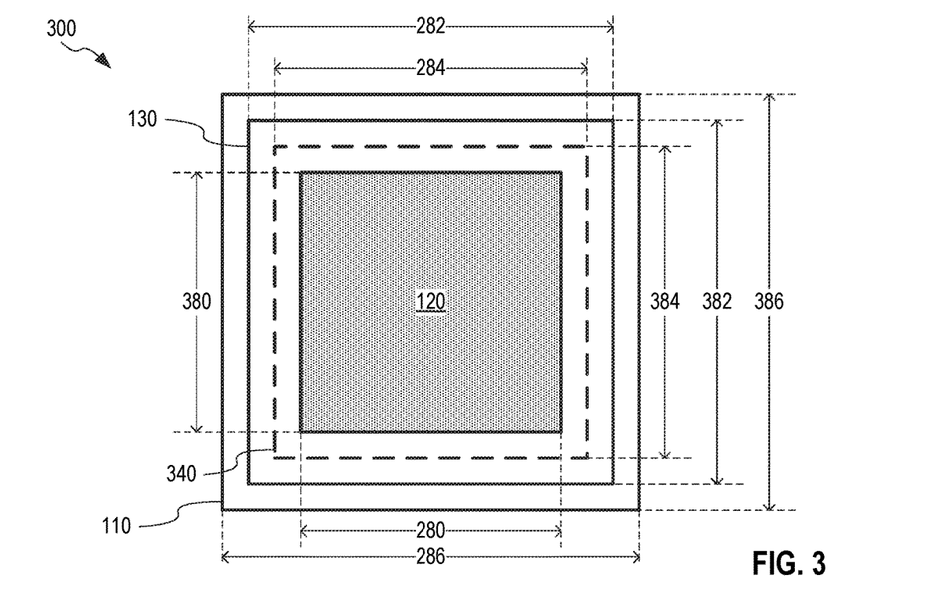
FIG. 3 illustrates one exemplary configuration of the camera module and bezel of FIGS. 1 and 2.

FIG. 3 illustrates one exemplary configuration 300 of camera module 100 and bezel 110, consistent with the depiction in FIG. 2. FIG. 3 shows wafer-level lens 130, the aperture 340 formed by spacer 140, image sensor 120, and bezel 110 projected along optical axis 190 onto a common plane. In configuration 300, each of wafer-level lens 130, aperture 340, image sensor 120, and bezel 110 has rectangular cross section in the transverse dimensions. In the horizontal dimension of FIG. 3, wafer-level lens 130, aperture 340, image sensor 120, and bezel 110 have the transverse extents shown in FIG. 2. In the vertical dimension of FIG. 3, wafer-level lens 130, aperture 340, image sensor 120/recessed lip 216, and bezel 110 have transverse extents 382, 384, 380, and 386, respectively. Transverse extent 380 is less than transverse extent 384, which is less than transverse extent 382, which is less than transverse extent 386. With the sizes of spacer 140 and image sensor 120 in configuration 300, it would be impossible to bond spacer 140 directly to image sensor 120 since image sensor 120 is smaller than aperture 340 in every transverse dimension. Instead, bezel 110 facilitates coupling of spacer 140 to image sensor 120.

In one embodiment of configuration 300, transverse extent 380 equals transverse extent 280, transverse extent 382 equals transverse extent 282, transverse extent 384 equals transverse extent 284, and transverse extent 386 equals transverse extent 286.

Figure 4:
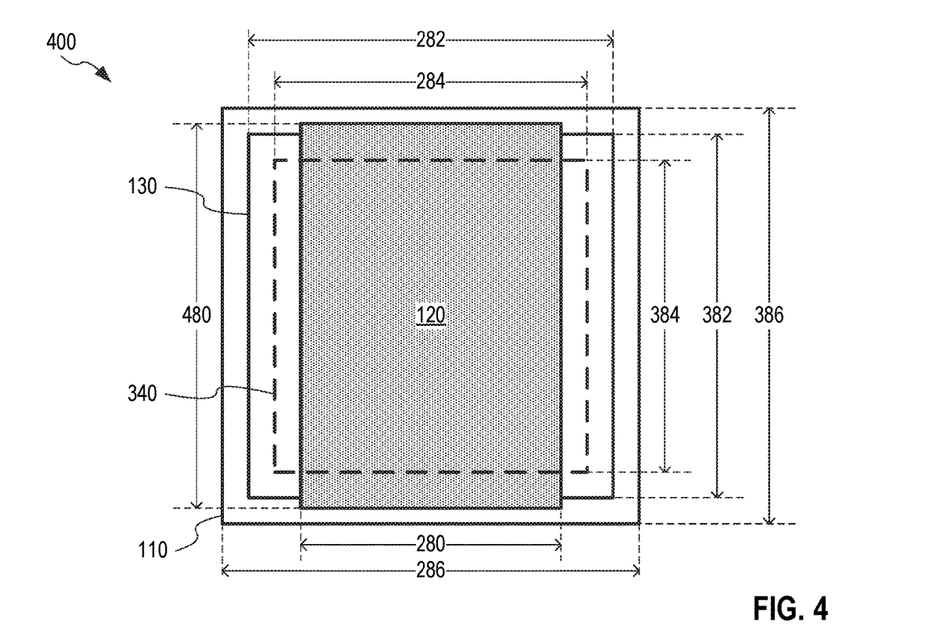
FIG. 4 illustrates another exemplary configuration of the camera module and bezel of FIGS. 1 and 2.

FIG. 4 illustrates another exemplary configuration 400 of camera module 100 and bezel 110, also consistent with the depiction in FIG. 2. Configuration 400 is similar to configuration 300 except that transverse extent 480 of image sensor 120/recessed lip 216, in the vertical dimension of FIG. 4, is greater than transverse extent 340. Thus, with the sizes of spacer 140 and image sensor 120 in configuration 400, it would be possible to bond spacer 140 directly to image sensor 120. However, a gap would exist in the horizontal dimension, allowing for light leakage into the camera module as well as contamination of interior surfaces of camera module 100. Bezel 110 prevents such contamination, and further facilitates prevention of such light leakage. In one embodiment, bezel 110 is opaque, or coated with an opaque material, and helps prevent undesirable light leakage into camera module 100.

Figure 5:
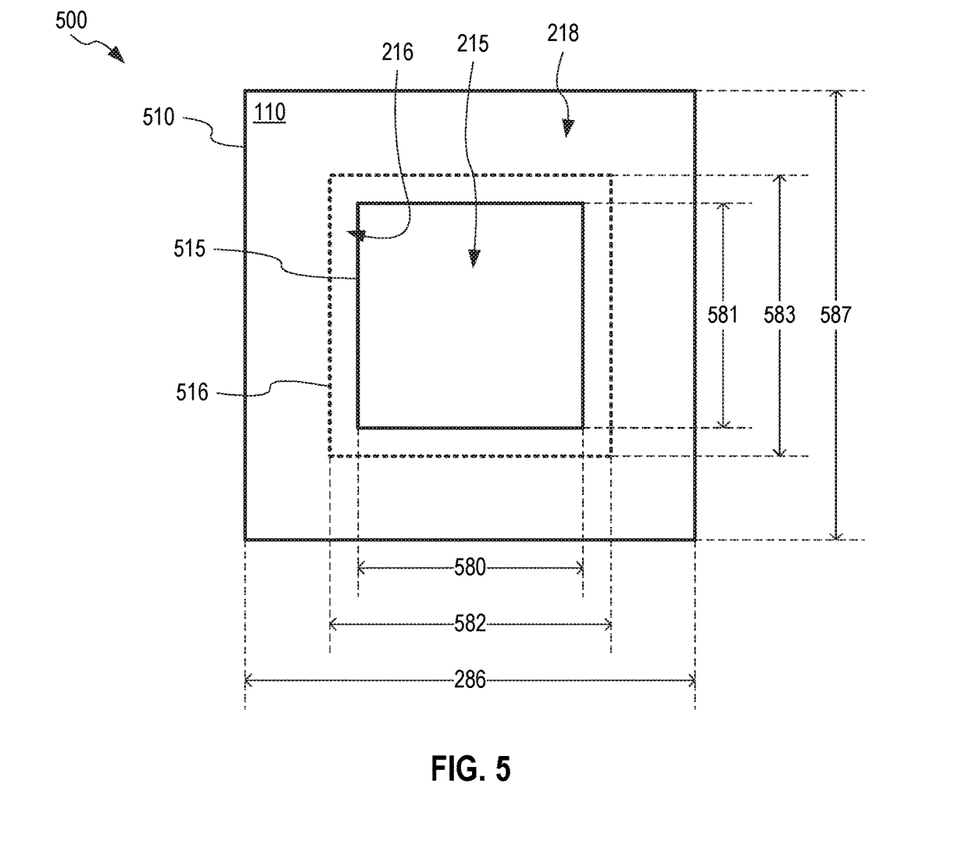
FIG. 5 illustrates one exemplary configuration the bezel of FIGS. 1 and 2.

FIG. 5 illustrates one exemplary configuration 500 of bezel 110, which is consistent with configuration 300. FIG. 5 is a top view of bezel 110 from above side 212. In configuration 500, bezel 110 has rectangular cross section with a rectangular perimeter 510. Perimeter 510 has transverse extents 286 and 587 in the horizontal and vertical dimensions, respectively, of FIG. 5. Aperture 215 has transverse extents 580 and 581 in the horizontal and vertical dimensions, respectively, of FIG. 5. Recessed lip 216 has transverse extents 582 and 583 in the horizontal and vertical dimensions, respectively, of FIG. 5. In an embodiment, transverse extent 581 equals transverse extent 580, transverse extent 583 equals transverse extent 582, and transverse extent 587 equals transverse extent 286.

Figure 6:
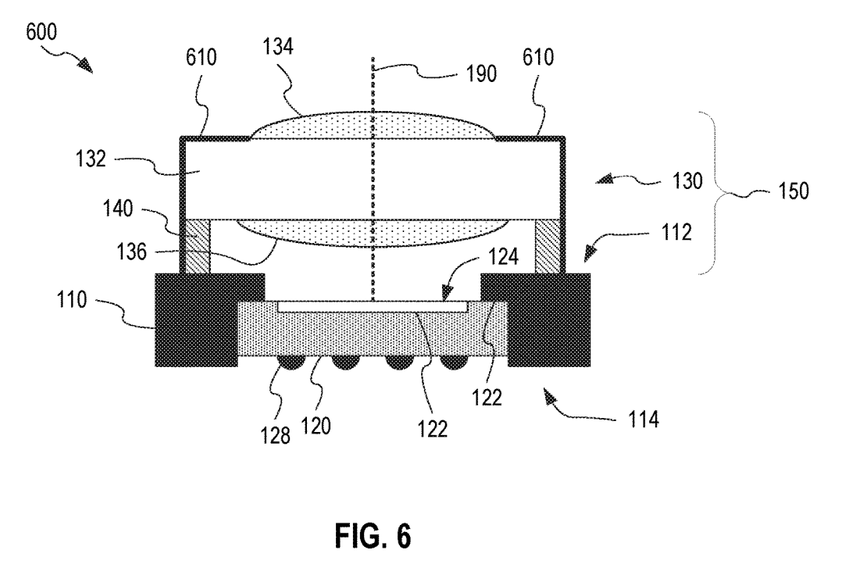
FIG. 6 illustrates a camera module with a light-tight housing in part based upon the bezel of FIGS. 1 and 2, according to an embodiment.

FIG. 6 illustrates one exemplary camera module 600 with a light-tight housing in part based upon bezel 110. Camera module 600 is an embodiment of camera module 100. Camera module 600 includes wafer-level lens unit 150, image sensor 120, and bezel 110, configured as discussed above in reference to FIGS. 1 and 2. Camera module 600 implements an embodiment of bezel 110, which is formed from an opaque material, such as black plastic. Thus, light cannot penetrate bezel 110. In addition, camera module 600 includes an opaque coating 610 deposited on wafer-level lens unit 150. Opaque coating 610 is for example a black plastic coating. Opaque coating 610 covers sides of wafer-level lens unit 150 facing away from optical axis 190, as well as the surface of substrate 132 facing away from image sensor 120 and not occupied by lens element 134. Opaque coating 610 and the opaque implementation of bezel 110 cooperate to shield camera module 600 from undesirable light leakage into camera module 600 through other routes than lens element 134.

In an alternative embodiment, not shown in FIG. 5, wafer-level lens 130 does not include lens element 134. In this alternative embodiment, opaque coating 610 covers the surface of substrate 132 facing away from image sensor 120 except for an area used to receive light into camera module 600.

Figure 7:
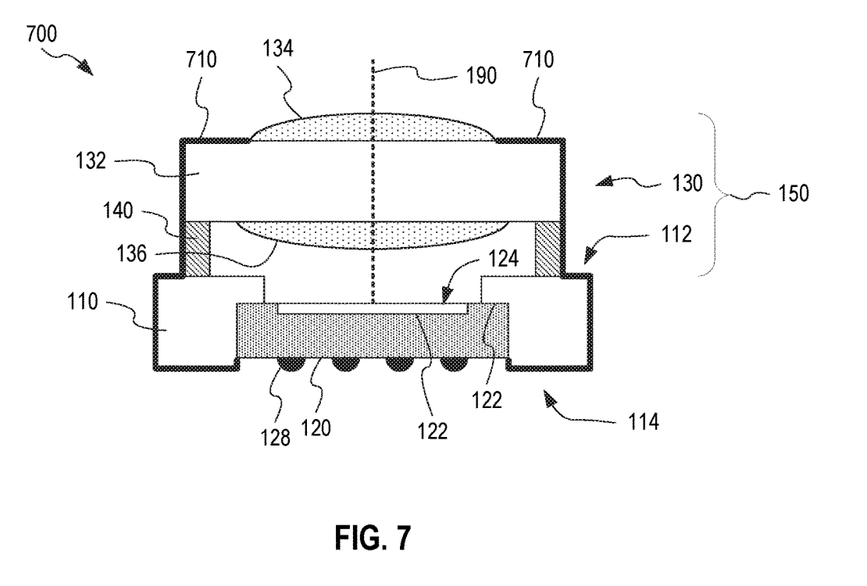
FIG. 7 illustrates another camera module with a light-tight housing in part based upon the bezel of FIGS. 1 and 2, according to an embodiment.

FIG. 7 illustrates another exemplary camera module 700 with a light-tight housing in part based upon bezel 110. Camera module 700 is an embodiment of camera module 100. Camera module 700 is similar to camera module 600 except for replacing opaque coating 610 with opaque coating 710 to allow for implementing a bezel 110 being made from a non-opaque material. Opaque coating 710 is an extension of opaque coating 610, which further covers outward facing surfaces of bezel 110 to prevent light leakage into camera module 700 between wafer-level lens unit 150 and image sensor 120.

Figure 8:
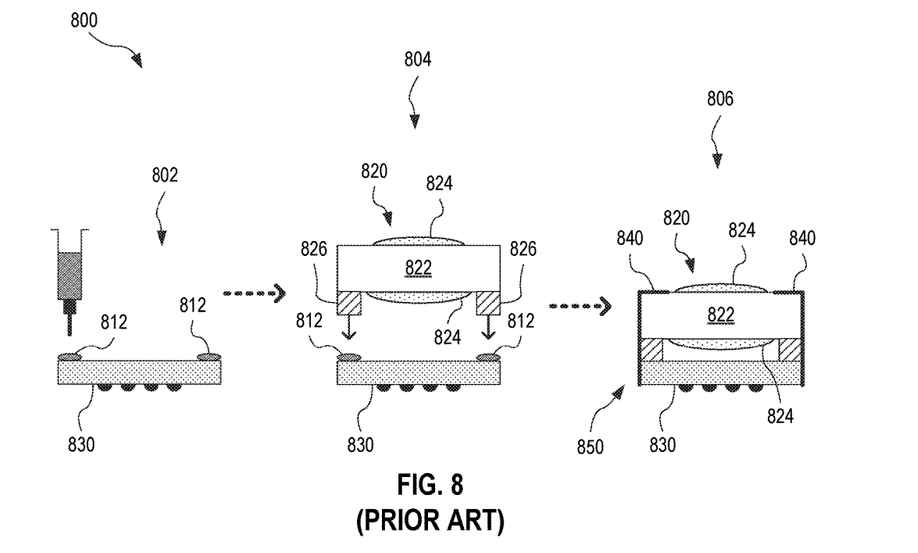
FIG. 8 illustrates a prior art die-level method for die level packaging of a prior art camera module with a light tight housing.

FIG. 8 illustrates a prior art die-level method 800 for die level packaging of a prior art camera module 850 with a light tight housing. In a step 802, glue 812 is deposited around the perimeter of an image sensor 830. In a step 804, a wafer-level lens unit 820 is aligned with image sensor 830 and deposited onto image sensor 830 on glue 812 to adhere wafer-level lens unit 820 to image sensor 830, so as to form prior art camera module 850. Wafer-level lens unit 820 is a wafer-level lens with a substrate 822, two lens elements 824, and a spacer 826 for coupling wafer-level lens unit 820 to image sensor 830. In a step 806, a black coating 840 is deposited on prior art camera module 850 around wafer-level lens unit 820 and image sensor 830 to form a light tight housing. Black coating 840 blocks at least a portion of unwanted light propagating toward image sensor 830, i.e., light that is not properly imaged onto image sensor 830 by wafer-level lens unit 820.

Figure 9:
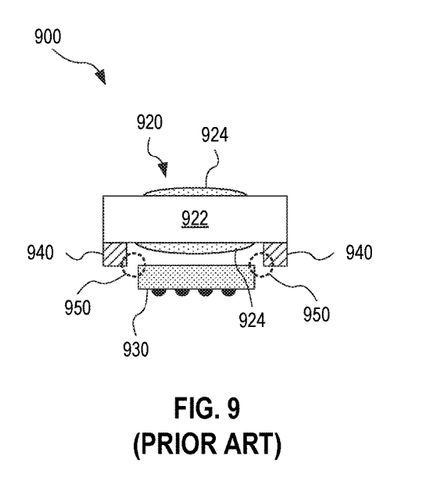
FIG. 9 illustrates a scenario, wherein the respective form factors of an image sensor and a wafer-level lens unit are such that the prior art method of FIG. 8 cannot be used to assemble the image sensor with the wafer-level lens unit to form a camera module.

FIG. 9 illustrates a scenario 900, wherein the respective form factors of an image sensor 930 and a wafer-level lens unit 920 are such that prior art method 800 cannot be used to assemble image sensor 930 with wafer-level lens unit 920 to form a camera module. Specifically, image sensor 930 has small transverse extent relative to wafer-level lens unit 920. This is a common scenario since image sensor manufacturing technology has advanced to produce very small image sensors, which is advantageous at least from a cost perspective. Wafer-level lens unit 920 includes a substrate 922, two lens elements 924, and a spacer 940. However, the lens element 924 intended to face image sensor 930 has a diameter so large that spacer 940 needed to bond substrate 922 to image sensor 930 cannot contact image sensor 930. A gap 950 exists between spacer 940 and image sensor 930.

Figure 10:
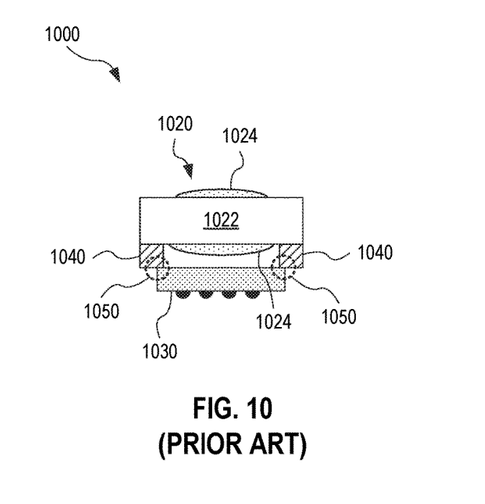
FIG. 10 illustrates a scenario, wherein the respective form factors of an image sensor and a wafer-level lens unit are such that the prior art method of FIG. 8 cannot be used to reliably assemble the image sensor with the wafer-level lens unit to form a camera module.

FIG. 10 illustrates another scenario 1000, wherein the respective form factors of an image sensor 1030 and a wafer-level lens unit 1020 are such that prior art method 800 cannot be used to reliably assemble image sensor 1030 with wafer-level lens unit 1020 to form a camera module. As in scenario 900, image sensor 1030 has small transverse extent relative to wafer-level lens unit 1020, although the discrepancy is smaller in scenario 1000. Wafer-level lens unit 1020 includes a substrate 1022, two lens elements 1024, and a spacer 1040. However, the lens element 1024 intended to face image sensor 1030 has a diameter so large that the contact region 1050 between spacer 1040 and image sensor 130, needed to bond substrate 1022 to image sensor 1030, is insufficient to achieve reliable bonding.

Figure 11:
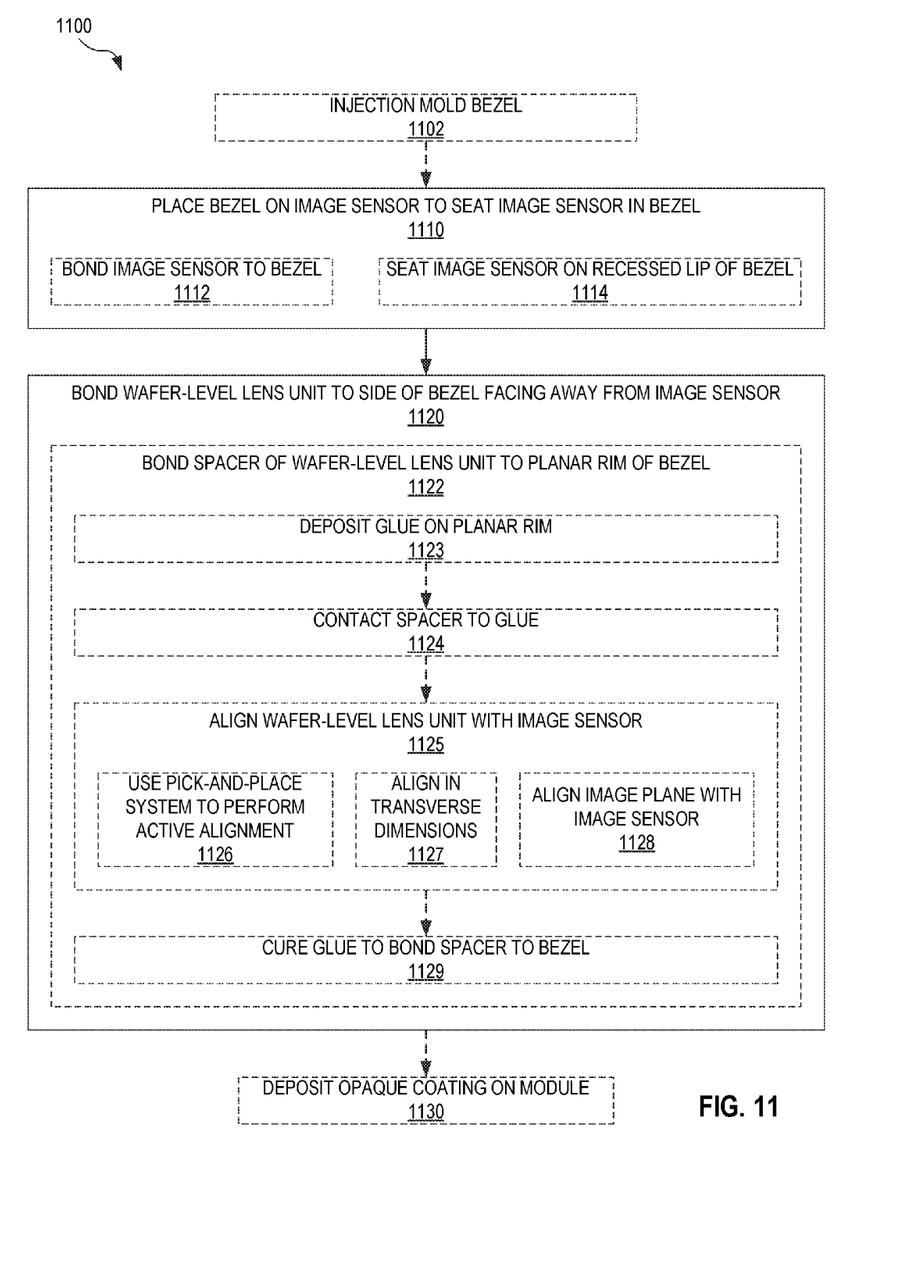
FIG. 11 illustrates a method for die-level packaging of a camera module, which utilizes a bezel to couple a wafer-level lens unit to an image sensor, according to an embodiment.

FIG. 11 illustrates one exemplary method 1100 for die-level packaging of a camera module, which utilizes a bezel to couple a wafer-level lens unit to an image sensor. By virtue of the bezel, method 1100 does not rely on direct contact between the wafer-level lens unit and the image sensor. Therefore, method 1100 is compatible with packaging of camera modules, wherein the image sensor has small transverse extent compared to the wafer-level lens unit. For example, method 1100 overcomes the issues illustrated in FIGS. 9 and 10. Method 1100 may utilize bezel 110 to make camera module 100.

FIGS. 12A-D illustrate, by example, steps of method 1100. FIGS. 11 and 12A-D are best viewed together.

Figure 12A:
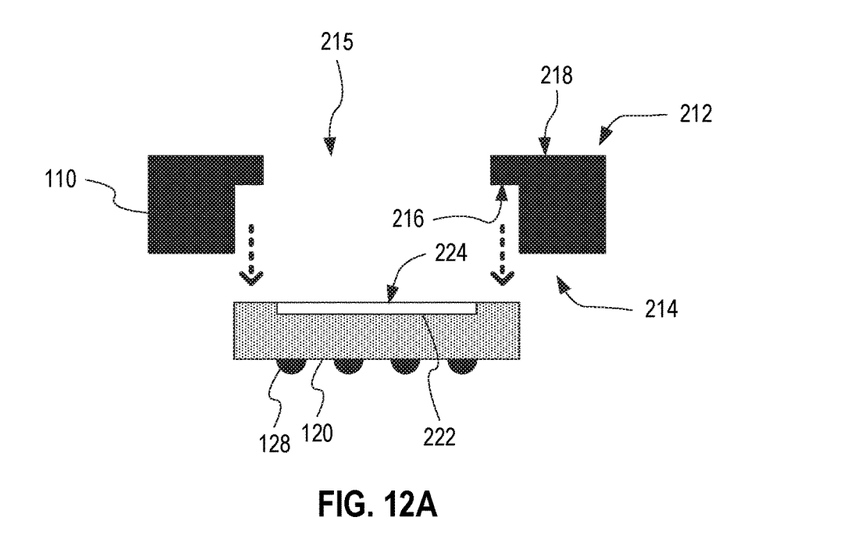
FIGS. 12A-D illustrate steps of the method of FIG. 11, according to an embodiment.

In a step 1110, method 1100 places a bezel on an image sensor to seat the image sensor in the bezel. FIG. 12A shows one example of step 1110, wherein bezel 110 is placed on image sensor 120, such that image sensor 120 is seated in bezel 110. It is understood that step 1110 may be performed with image sensor 120 being the stationary object (as shown in FIG. 12A), with bezel 110 being the stationary object, or by moving both of image sensor 120 and bezel 110 toward each other. Likewise, step 1110 may be performed in any orientation, for example with bezel 110 below image sensor 120 and light receiving surface 224 of image sensor 120 facing downward toward bezel 110.

Step 1110 may include one or both of steps 1112 and 1114. Step 1112 bonds the image sensor to the bezel. In one example of step 1112, glue is deposited on either image sensor 120 or bezel 110 (for example on recessed lip 216) to bond image sensor 120 to bezel 110. Step 1114 seats the image sensor on a recessed lip of the bezel. In one example of step 1114, shown in FIG. 12A, image sensor 112 is seated on recessed lip 216.

Figure 12B:
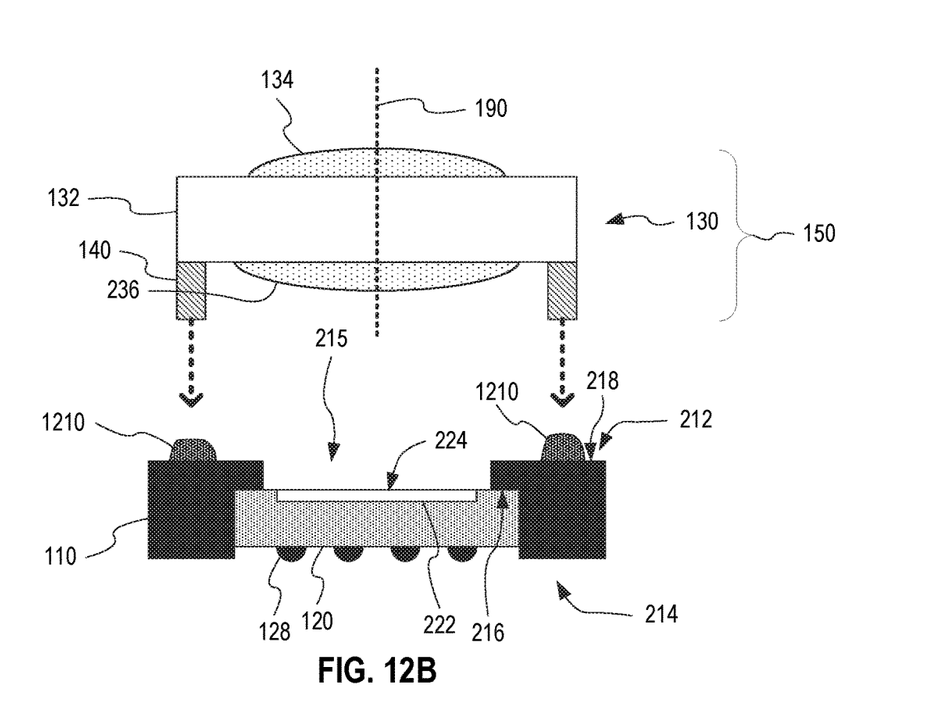

In a step 1120, method 1100 bonds a wafer-level lens unit to a side of the bezel facing away from the image sensor to form a camera module. In one example of step 1120, wafer-level lens unit 150 is bonded to side 212 of bezel 110 to form camera module 1200 (see FIG. 12C). Camera module 1200 is an embodiment of camera module 100. In an embodiment, step 1120 includes a step 1122 of bonding a spacer of the wafer-level lens unit to a planar rim of the bezel, so as to bond the wafer-level lens unit to the bezel. In one example of step 1122, spacer 140 is bonded to planar rim 218 of bezel 110. Step 1122 may implement steps 1123, 1124, and 1129. Step 1123 deposits glue on the planar rim of the bezel. FIG. 12B illustrates one example of step 1123. In this example, glue 1210 is deposited on planar rim 218. Step 1124 contacts the spacer of the wafer-level lens unit to the glue. In one example of step 1124, spacer 140 is contacted to glue 1210 as cooperatively shown by FIGS. 12B and 12C. Step 1129 cures the glue to bond the spacer to the bezel. Step 1129 may utilize light to cure the glue, for example ultraviolet light to cure photosensitive epoxy. Alternatively, or in combination therewith, step 1129 may utilize heat and/or other methods known in the art to cure the glue. In one example of step 1129, glue 1210 may be cured to complete the process of bonding spacer 140 to planar rim 218.

In certain embodiments, step 1122 includes a step 1125 of actively aligning the wafer-level lens unit to the image sensor. Step 1125 monitors the relative positioning of the wafer-level lens unit and the image sensor to ensure a proper relative positioning of the wafer-level lens unit and the image sensor. Although FIG. 11 shows step 1125 as being performed between steps 1124 and 1129, step 1125 may overlap at least in part with step 1124 and/or step 1129.

Step 1125 may implement a step 1126 of using a pick-and-place system to perform the active alignment. For example, a robot arm may hold wafer-level lens unit 150 while optical monitoring equipment monitors the relative positioning of wafer-level lens unit 150 and image sensor 120. The robot arm is adjusted based upon data generated by the optical monitoring equipment. The optical monitoring equipment may include or cooperate with image sensor 120 to determine the relative alignment between wafer-level lens unit 150 and image sensor 120 based upon images captured by image sensor 120.

In one embodiment, step 1125 includes a step 1127 of aligning the wafer-level lens unit to the image sensor in transverse dimensions. In one example of step 1127, optical axis 190 of wafer-level lens unit 150 is centered on pixel array 222 of image sensor 120.

Figure 12C:
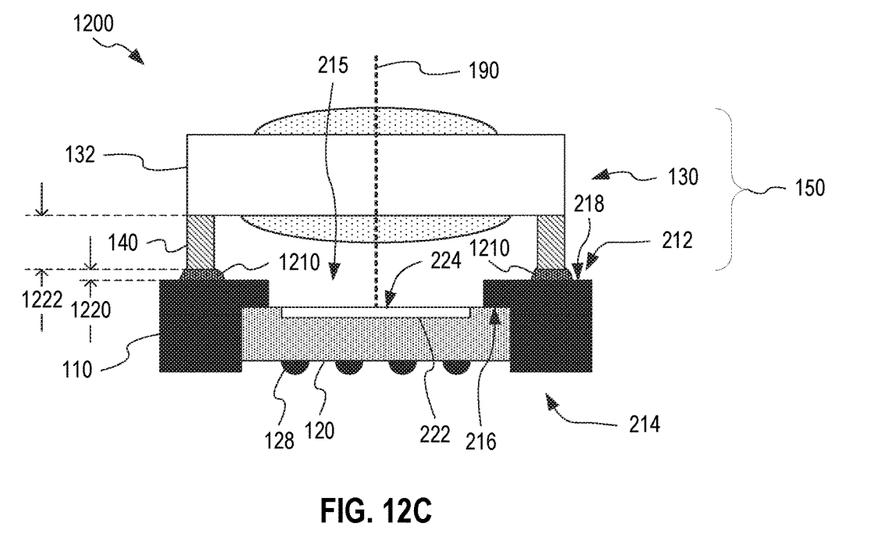

In another embodiment, step 1125 includes a step 1128 of aligning the image plane of the wafer-level lens with the image sensor, such that the wafer-level lens unit and the image sensor cooperate to generate focused images. In one example of step 1128, wafer-level lens unit 150 is positioned such that the image plane of wafer-level lens 130 coincides with light receiving surface 224 and/or pixel array 222. Step 1128 may take advantage of the deformability of glue 1210, before curing in step 1129, and adjust the thickness 1220 of a layer of glue 1210 between spacer 140 and planar rim 218, as shown in FIG. 12C, to align the image plane of wafer-level lens 130 with image sensor 120. In other words, thickness 1220 is adjustable and cooperates with the height 1222 of spacer 140 to align the image plane of wafer-level lens 130 with image sensor 120.

In yet another embodiment, step 1125 includes both step 1127 and 1128.

Each of steps 1127 and 1128 may be performed in cooperation with step 1126 to achieve proper alignment.

In embodiments of camera module 1200 formed by an embodiment of method 1100, which does not include step 1128, spacer 140 may be in direct contact with planar rim 218, without glue 1210 or with only a minimal layer of glue 1210 between planar rim 218 and spacer 140.

Without departing from the scope hereof, in embodiments of method 1125 that do not implement step 1125, the order of steps 1110 and 1120 may be reversed, as compared to that shown in FIG. 11.

Figure 12D:
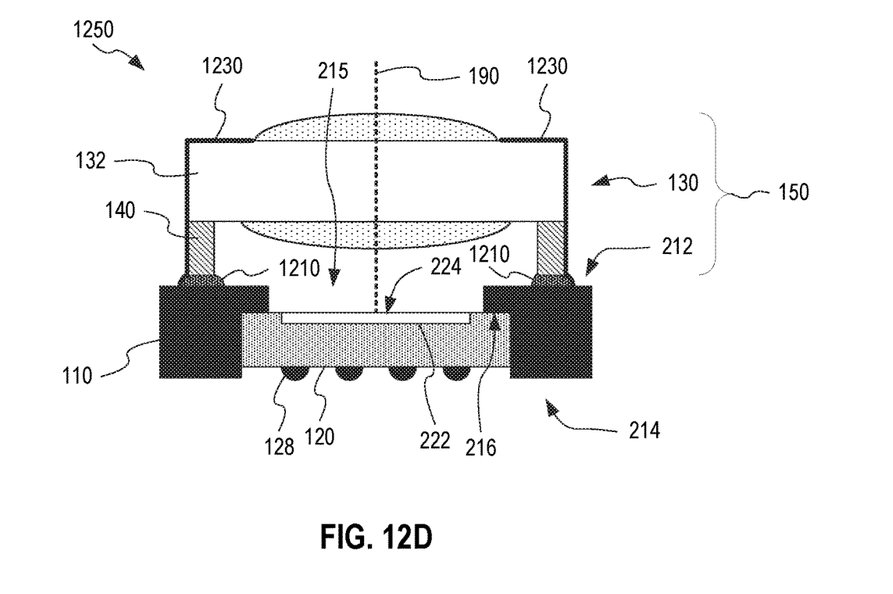

Optionally, method 1130 further includes a step 1130 of depositing an opaque coating on the camera module to prevent undesirable light leakage into the camera module. FIG. 12D shows one example of step 1130, wherein an opaque coating 1230 (similar to opaque coating 610) is deposited on wafer-level lens unit 150 to form a light-tight camera module 1250. Light-tight camera module 1250 is an embodiment of camera module 100.

Method 1100 may further include a step 1102 of injection molding the bezel. In one example of step 1102, bezel 110 is injection molded from a polymer resin, for example an opaque polymer resin.

While FIGS. 12A-D show bezel 110 as being opaque, bezel 110 may be at least partly transmissive to light, without departing from the scope hereof. In embodiments of camera module 1250, wherein bezel 110 is not opaque, opaque coating 1230 extends around the outward facing surfaces of bezel 110 in a manner similar to opaque coating 710.

Figure 13A:
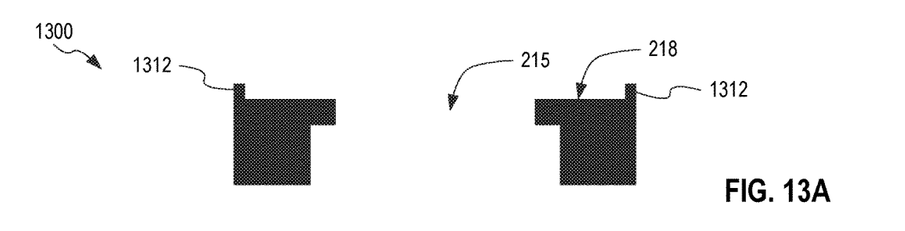
FIGS. 13A and 13B illustrate a bezel having a flange for retaining glue used to bond a wafer-level lens unit to the bezel, according to an embodiment.
Figure 13B:
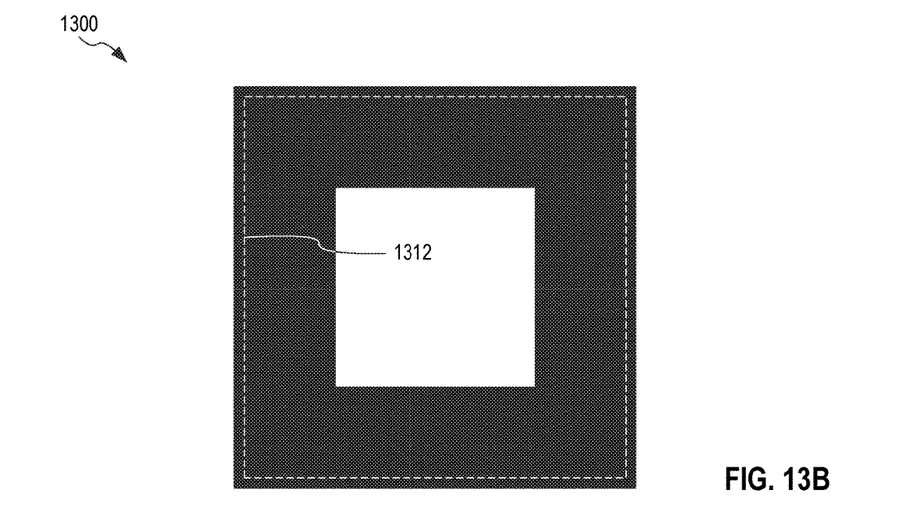

FIGS. 13A and 13B illustrate one exemplary bezel 1300 having a flange for retaining glue used to bond a wafer-level lens unit to bezel 1300. Bezel 1300 is an embodiment of bezel 110. FIG. 13A shows bezel 1300 in cross sectional side view, and FIG. 13B is a top plan view of bezel 1300. FIGS. 13A and 13B are orthogonal views of bezel 1300 and are best viewed together.

Bezel 1300 includes a flange 1312 that surrounds planar rim 218. Thus, in bezel 1300, planar rim 218 does not extend to the outer perimeter of bezel 1300. Flange 1312 extends along the full outer perimeter of bezel 1300 and functions to retain glue deposited on planar rim 218. Bezel 1300 may be opaque, as shown in FIGS. 13A and 13B, or at least partly transmissive to light.

Figure 14:
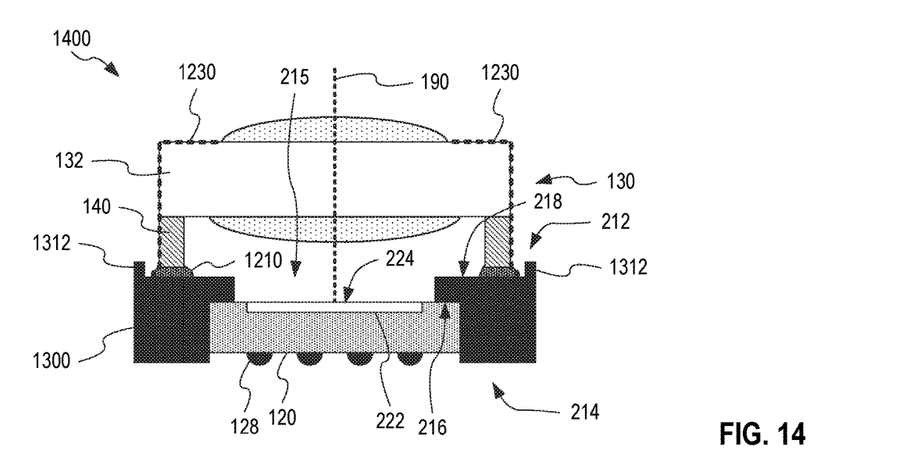
FIG. 14 illustrates a camera module that implements the bezel of FIGS. 13A and 13B, according to an embodiment.

FIG. 14 illustrates one exemplary camera module 1400 that implements bezel 1300. Camera module 1400 is an embodiment of camera module 100. In one embodiment, camera module 1400 is an extension of camera module 1200, which implements bezel 1300 with flange 1312 to retain glue 1210. In another embodiment, camera module 1400 is an extension of light-tight camera module 1250, which implements bezel 1300 with flange 1312 to retain glue 1210.

Figure 15A:
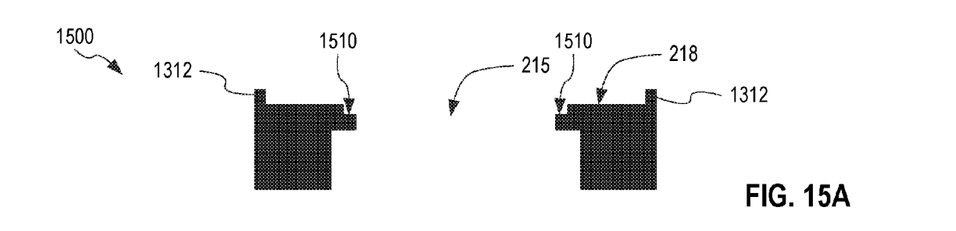
FIGS. 15A and 15B illustrate a bezel having a recessed lip configured to hold a wavelength filter, according to an embodiment.
Figure 15B:
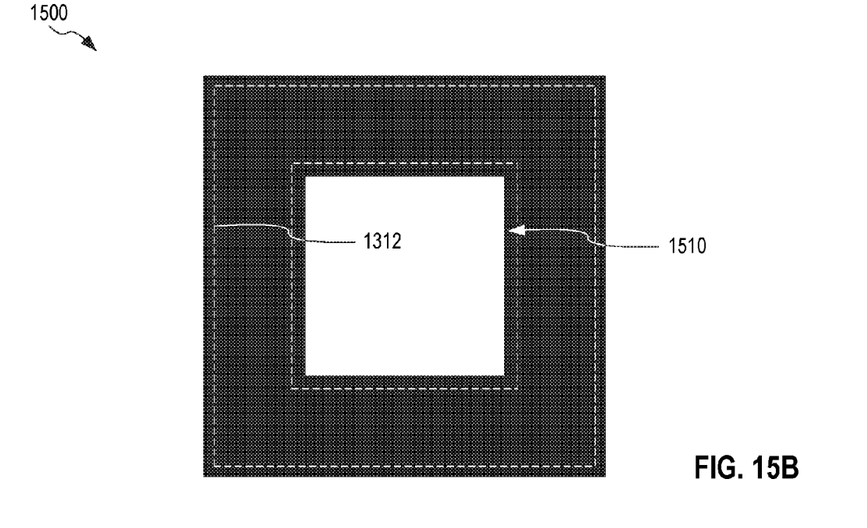

FIGS. 15A and 15B illustrate one exemplary bezel 1500 having a recessed lip configured to hold a wavelength filter. Bezel 1500 is an embodiment of bezel 110. FIG. 15A shows bezel 1500 in cross sectional side view, and FIG. 15B is a top plan view of bezel 1500. FIGS. 15A and 15B are orthogonal views of bezel 1500 and are best viewed together.

Bezel 1500 includes a recessed lip 1510 that surrounds aperture 215. Recessed lip 1510 is configured for seating a wavelength filter thereon, for the purpose of spectrally filtering light propagating from a wafer-level lens bonded to one side of bezel 1500 to an image sensor seated to the other side of bezel 1500. Optionally, bezel 1500 also includes flange 1312.

Figure 16:
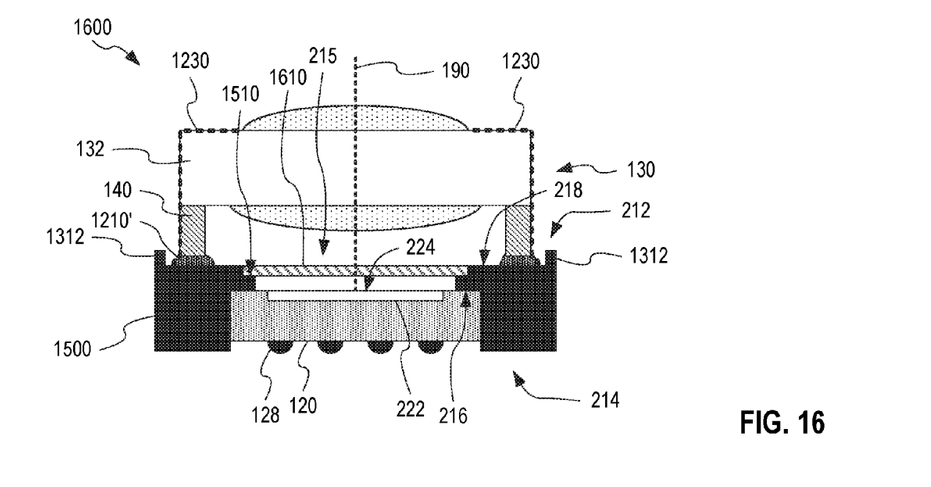
FIG. 16 illustrates a camera module that implements the bezel of FIGS. 15A and 15B, according to an embodiment.

FIG. 16 illustrates one exemplary camera module 1600 that implements bezel 1500 and includes a wavelength filter seated in bezel 1500. Camera module 1600 is an embodiment of camera module 100. In one embodiment, camera module 1600 is an extension of camera module 1200, which implements bezel 1500 and includes a wavelength filter 1610 seated on recessed lip 1510 of bezel 1500. In one example, wavelength filter 1610 is an infrared block that blocks infrared light. In another example, wavelength filter 1610 is configured to transmit only infrared light. In yet another embodiment, wavelength filter 1610 is another form of high-pass, low-pass, single pass-band, or multiple pass-band filter. In another embodiment, camera module 1600 is an extension of light-tight camera module 1250, which implements bezel 1500 and includes a wavelength filter 1610 seated on recessed lip 1510 of bezel 1500. In yet another embodiment, camera module 1600 further implements flange 1312. This embodiment of camera module 1600 is an extension of camera module 1400, which implements bezel 1500 and includes a wavelength filter 1610 seated on recessed lip 1510 of bezel 1500. However, without departing from the scope hereof, camera module 1600 need not include flange 1312.

Figure 17:
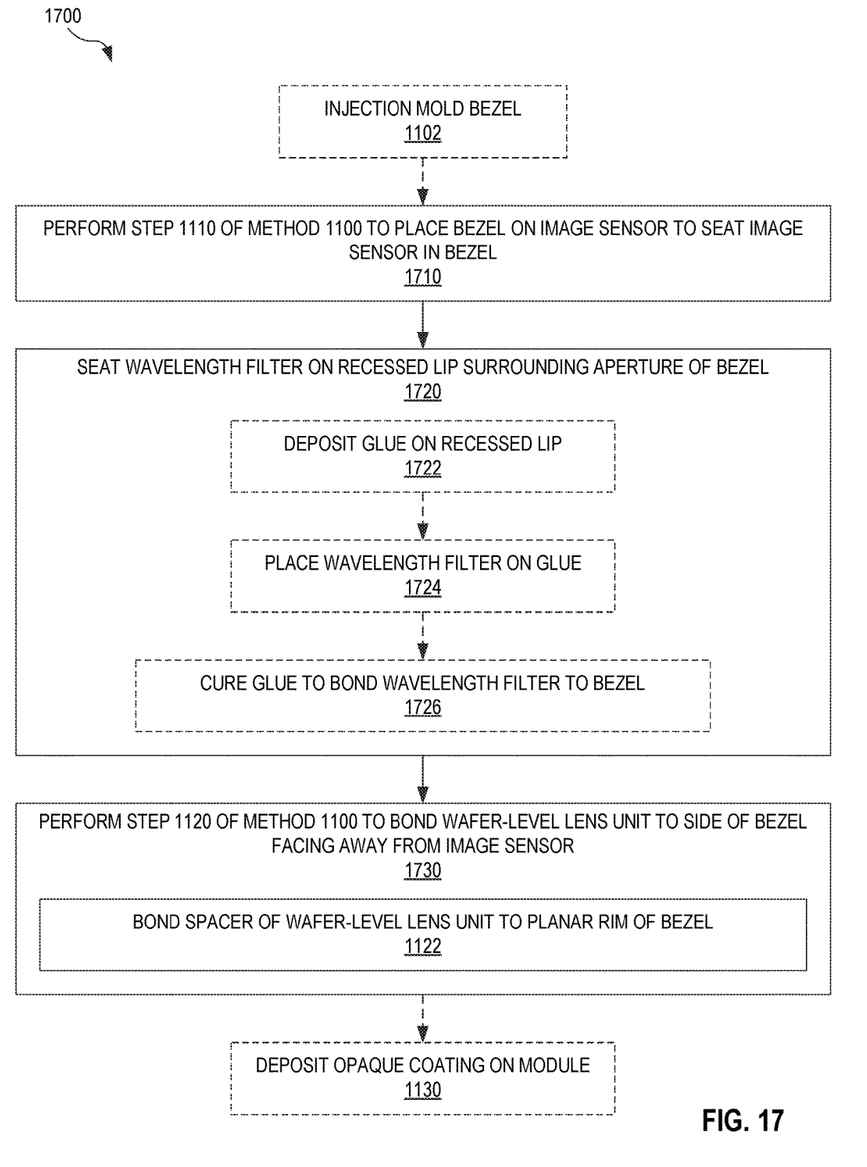
FIG. 17 illustrates a method for die-level packaging of a camera module, which utilizes a bezel to couple together a wafer-level lens unit, an image sensor, and a wavelength filter, according to an embodiment.

FIG. 17 illustrates one exemplary method 1700 for die-level packaging of a camera module, which utilizes a bezel to couple together a wafer-level lens unit, an image sensor, and a wavelength filter. Method 1700 is an embodiment of method 1100. In one example, method 1700 uses bezel 1500 to couple together wafer-level lens unit 150, image sensor 120, and wavelength filter 1610, so as to assemble camera module 1600.

Method 1700 is similar to method 1100. Method 1700 includes steps 1710, 1720, and 1730. In step 1710, method 1700 performs step 1110 of method 1100 to seat the image sensor in the bezel, as discussed above in reference to FIG. 11. In one example of step 1710, image sensor 120 is seated on recessed lip 216 of bezel 1500.

Next, method 1700 performs step 1720. In step 1720, method 1700 seats a wavelength filter on a recessed lip surrounding the aperture of the bezel. The recessed lip faces away from the image sensor. In one example of step 1720, wavelength filter 1610 is seated on recessed lip 1510 of bezel 1500. Step 1720 may glue wavelength filter 1610 to recessed lip 1510. In an embodiment, step 1720 includes steps 1722, 1724, and 1726. In step 1722, glue is deposited on the recessed lip. In step 1724, the wavelength filter is placed on the glue. Step 1726 cures the glue to bond the wavelength filter to the bezel. In one example of steps 1722, 1724, and 1726, glue is deposited on recessed lip 1510 of bezel 1500, wavelength filter 1610 is placed on the glue, and the glue is cured to bond wavelength filter 1610 to recessed lip 1510 of bezel 1500.

Step 1730 performs step 1120 of method 1100 to bond a wafer-level lens unit to the side of the bezel facing away from the image sensor. Step 1730 implements step 1122 such that the wafer-level lens unit is bonded to a planar rim that surrounds the recessed lip holding the wavelength filter. In one example of step 1730, wafer-level lens unit 150 is bonded to planar rim 218 of bezel 1500, so as to assemble camera module 1600. Step 1730 may implement step 1122 with one or more of steps 1122 through 1129.

Without departing from the scope hereof, a portion of step 1730 may be performed concurrently or interlaced with a portion of step 1720. For example, a glue deposition step of step 1730 (e.g., step 1123) may be performed in the same operation as glue deposition step 1722.

Method 1700 may further include one or both of steps 1102 and 1130.

Combinations of Features

Features described above as well as those claimed below may be combined in various ways without departing from the scope hereof. For example, it will be appreciated that aspects of one bezel for die level packaging of a camera module, or an associated camera module or method, described herein may incorporate or swap features of another bezel for die level packaging of a camera module, or another associated camera module or method, described herein. The following examples illustrate possible, non-limiting combinations of embodiments described above. It should be clear that many other changes and modifications may be made to the methods and device herein without departing from the spirit and scope of this invention:

(A1) A bezel for die level packaging of a camera module may include (a) a recessed lip surrounding an aperture of the bezel and facing in a first direction, the recessed lip being configured for seating thereon an image sensor and (b) a planar rim surrounding the aperture and facing in a second direction opposite the first direction, wherein the planar rim is configured for bonding thereto a wafer-level lens unit implementing a wafer-level lens for delivering light to the image sensor through the aperture, and wherein the transverse extent of the planar rim across the aperture in a dimension orthogonal to the first direction exceeds the corresponding transverse extent of the recessed lip.

(A2) In the bezel denoted as (A1), the transverse extent of the planar rim across the aperture, in the dimension orthogonal to the first direction, and the corresponding transverse extent of the recessed lip may be cooperatively configured to accommodate the wafer-level lens unit having larger transverse extent than the image sensor.

(A3) Either or both of the bezels denoted as (A1) and (A2) may further include a flange surrounding the planar rim to retain glue used to bond the wafer-level lens unit to the planar rim.

(A4) Any of the bezels denoted as (A1) through (A3) may further include a second lip configured for seating thereon a wavelength filter for spectrally filtering the light, wherein the second lip (i) surrounds the aperture, (ii) is surrounded by and recessed from the planar rim, and (iii) faces in the second direction.

(A5) In any of the bezels denoted as (A1) through (A4), the recessed lip and the planar rim may have rectangular outer perimeter, in plane orthogonal to the first direction, to accommodate the wafer-level lens unit and the image sensor having rectangular cross section in dimensions orthogonal to the first direction.

(A6) Any of the bezels denoted as (A1) through (A5) may be composed of an opaque polymer.

(B1) A camera module may include (a) a wafer-level lens unit including at least one wafer-level lens, wherein the wafer-level lens unit has first transverse extent in a first dimension orthogonal to optical axis of the wafer-level lens, (b) an image sensor having second transverse extent in a second dimension parallel to light-receiving surface of the image sensor, wherein the second transverse extent is smaller than the first transverse extent, and (c) a bezel having (i) opposite facing first and second sides, wherein the wafer-level unit is bonded to the first side and the image sensor is inserted into the second side and bonded to the bezel, such that the first dimension is aligned with the second dimension, and (ii) an aperture configured to transmit light from the wafer-level lens to the light-receiving surface.

(B2) In the camera module denoted as (B1), the wafer-level lens unit may include a first wafer-level lens having a substrate and at least one lens element disposed on the substrate, and a spacer bonded between the substrate and the bezel to couple the first wafer-level lens to the bezel.

(B3) In the camera module denoted as (B2), the spacer may form an opening around an optical pathway for the light propagating from the wafer-level lens to the light-receiving surface.

(B4) In the camera module denoted as (B3), the opening may have third transverse extent in the first dimension, wherein the third transverse extent exceeds the second transverse extent.

(B5) In either or both of the camera modules denoted as (B3) and (B4), the projection of the image sensor onto the spacer may be entirely within the opening.

(B6) In any of the camera modules denoted as (B3) through (B5), in dimensions orthogonal to the optical axis, the opening may have rectangular outer perimeter, the spacer may have rectangular outer perimeter, and the image sensor may have rectangular cross section.

(B7) Any of the camera modules denoted as (B1) through (B6) may further include a glue layer bonding the wafer-level lens unit to the bezel.

(B8) In the camera module denoted as (B7), the thickness, along the optical axis, of the glue layer and a spacer of the wafer-level lens may cooperate to place the image sensor at image plane of the wafer-level lens unit.

(B9) In either or both of the camera modules denoted as (B7) and (B8), the first side of the bezel may include a planar rim, surrounding the aperture and configured for bonding the wafer-level lens unit thereto, and a flange surrounding the planar rim to retain the glue.

(B10) Any of the camera modules denoted as (B1) through (B9) may further include a wavelength filter for spectrally filtering the light.

(B11) In the camera modules denoted as (B10), the first side of the bezel may further include a planar rim surrounding the aperture and configured for bonding the wafer-level lens unit thereto, and a lip configured for seating thereon the wavelength filter for spectrally filtering the light.

(B12) In the camera module denoted as (B11), the lip may surround the aperture, may be surrounded by and recessed from the planar rim, and may face the wafer-level lens unit.

(B13) In any of the camera modules denoted as (B1) through (B12), the bezel may further include a recessed lip facing the image sensor, wherein the image sensor is seated on the recessed lip.

(B14) In any of the camera modules denoted as (B1) through (B13), the bezel may be composed of an opaque polymer.

(C1) A method for die-level packaging of a camera module may include (a) placing a bezel on an image sensor to seat the image sensor in the bezel, wherein the bezel has an aperture allowing light transmission through the bezel to light receiving surface of the image sensor, and wherein the image sensor has first transverse extent in a first dimension parallel to the light-receiving surface of the image sensor, and (b) bonding a wafer-level lens unit to the side of the bezel facing away from the image sensor, wherein the wafer-level lens unit includes at least one wafer-level lens, and wherein the wafer-level lens unit has second transverse extent orthogonal to the optical axis of the wafer-level lens such that the second transverse extent exceeds the first transverse extent.

(C2) In the method denoted as (C1), the step of bonding may include bonding a spacer of the wafer-level lens unit onto a planar rim of the bezel, wherein the spacer forms an opening around an optical pathway for light propagating from the wafer-level lens to the light-receiving surface, and wherein the opening has third transverse extent in the second dimension such that the third transverse extent exceeds the first transverse extent.

(C3) In the method denoted as (C2), the step of bonding may include positioning the spacer such that projection of the image sensor onto the spacer is entirely within the opening.

(C3) In the method denoted as (C3), the step of bonding may include depositing glue on the planar rim, contacting the spacer to the glue, aligning the wafer-level lens unit with the image sensor, and curing the glue to bond the spacer to the bezel.

(C4) In the method denoted as (C3), the step of aligning may include using a pick and place system and optical information to actively align the wafer-level lens unit with the image sensor.

(C5) In either or both of the methods denoted as (C3) and (C4), the step of aligning may include positioning the wafer-level lens unit such that image plane of the wafer-level lens unit coincides with the image sensor.

(C6) Any of the methods denoted as (C1) through (C5) may further include seating a wavelength filter on a recessed lip that surrounds the aperture and is surrounded by a planar rim of the bezel.

(C7) In the method denoted as (C6), the step of bonding may include bonding the wafer-level lens unit to the planar rim.

(C8) The method denoted as (C7) may further include (i) depositing glue on the recessed lip and on the planar rim, (ii) after the step of seating, curing the glue on the recessed lip to bond the wavelength filter to the bezel, and (iii) in the step of bonding, curing the glue on the planar rim to bond the wafer-level lens unit to the bezel.

(C9) Any of the methods denoted as (C1) through (C8) may further include injection molding the bezel from an opaque polymer resin.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and systems, which, as a matter of language, might be said to fall therebetween.

What is claimed is:

1. A lens-bezel assembly for die level packaging of a camera module, comprising:
   a recessed lip surrounding an aperture of the bezel and facing in a first direction, the recessed lip being configured for seating thereon an image sensor;
   a planar rim adjacent and surrounding the aperture and facing in a second direction opposite the first direction, transverse extent of the planar rim across the aperture in a second dimension orthogonal to the first direction exceeding corresponding transverse extent of the recessed lip; and
   a wafer-level lens unit for delivering light to the image sensor through the aperture, the wafer-level lens unit including:
   (a) a first wafer-level lens, including a substrate and at least one lens element disposed on the substrate, and
   (b) a spacer bonded between the substrate and the planar rim, to couple the first wafer-level lens to the bezel, the spacer forming an opening around optical pathway for the light propagating from the wafer-level lens to a light-receiving surface of the image sensor, transverse extent of the opening, in the second dimension, exceeding the corresponding transverse extent of the recessed lip.

2. The bezel of claim 1, further comprising a flange surrounding the planar rim to retain glue used to bond the wafer-level lens unit to the planar rim.

3. A lens-bezel assembly for die level packaging of a camera module, comprising:
- a recessed lip surrounding an aperture of the bezel and facing in a first direction, the recessed lip being configured for seating thereon an image sensor;
- a planar rim surrounding the aperture and facing in a second direction opposite the first direction transverse extent of the planar rim across the aperture in a second dimension orthogonal to the first direction exceeding corresponding transverse extent of the recessed lip;
- a flange surrounding the planar rim to retain glue used to bond the wafer-level lens unit to the planar rim;
- a wafer-level lens unit for delivering light to the image sensor through the aperture, the wafer-level lens unit including:
  - (a) a first wafer-level lens, including a substrate and at least one lens element disposed on the substrate, and
  - (b) a spacer bonded between the substrate and the planar rim, to couple the first wafer-level lens to the bezel, the spacer forming an opening around optical pathway for the light propagating from the wafer-level lens to a light-receiving surface of the image sensor, transverse extent of the opening, in the second dimension, exceeding the corresponding transverse extent of the recessed lip; and
- a second lip configured for seating thereon a wavelength filter for spectrally filtering the light, the second lip (a) surrounding the aperture, (b) being surrounded by and recessed from the planar rim, and (c) facing in the second direction.

4. The bezel of claim 1, the recessed lip and the planar rim having rectangular outer perimeter, in plane orthogonal to the first direction, to accommodate the wafer-level lens unit and the image sensor having rectangular cross section in dimensions orthogonal to the first direction.

5. The bezel of claim 1, being composed of an opaque polymer.

6. A camera module, comprising:
- a wafer-level lens unit having first transverse extent in a first dimension orthogonal to optical axis of the wafer-level lens;
- an image sensor having second transverse extent, in a second dimension parallel to light-receiving surface of the image sensor, the second transverse extent being smaller than the first transverse extent; and
- a bezel having:
  - (a) opposite facing first and second sides, the wafer-level lens unit being bonded to the first side and the image sensor being inserted into the second side and bonded directly to the bezel, such that the first dimension is aligned with the second dimension, and
  - (b) an aperture configured to transmit light from the wafer-level lens to the light-receiving surface;
- the wafer-level lens unit including:
  - (a) a first wafer-level lens, including a substrate and at least one lens element disposed on the substrate, and
  - (b) a spacer bonded between the substrate and the bezel, to couple the first wafer-level lens to the bezel, the spacer forming an opening around optical pathway for the light propagating from the wafer-level lens to the light-receiving surface, the opening having third transverse extent in the first dimension, the third transverse extent exceeding the second transverse extent.

7. The camera module of claim 6, projection of the image sensor onto the spacer being entirely within the opening.

8. The camera module of claim 6, further comprising a glue layer bonding the wafer-level lens unit to the bezel.

9. The camera module of claim 8, thickness, along the optical axis, of the glue layer and the spacer cooperating to place the image sensor at image plane of the wafer-level lens unit.

10. The camera module of claim 8, the first side of the bezel comprising:
- a planar rim surrounding the aperture and configured for bonding the wafer-level lens unit thereto; and
- a flange surrounding the planar rim to retain the glue.

11. The camera module of claim 6, in dimensions orthogonal to the optical axis, the opening having rectangular outer perimeter, the spacer having rectangular outer perimeter, and the image sensor having rectangular cross section.

12. The camera module of claim 6,
- further comprising a wavelength filter for spectrally filtering the light; and
- the bezel further comprising:
  - on the first side, a planar rim surrounding the aperture and configured for bonding the wafer-level lens unit thereto, and
  - a lip configured for seating thereon the wavelength filter for spectrally filtering the light, the lip (i) surrounding the aperture, (ii) being surrounded by and recessed from the planar rim, and (iii) facing the wafer-level lens unit.

13. The camera module of claim 6, the bezel further comprising a recessed lip facing the image sensor, the image sensor being seated on the recessed lip.

14. The camera module of claim 6, the bezel being composed of an opaque polymer.

* * * * *